United States Patent
Nakata

(10) Patent No.: US 8,039,918 B2
(45) Date of Patent: Oct. 18, 2011

(54) SEMICONDUCTOR PHOTO DETECTOR

(75) Inventor: Takeshi Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 157 days.

(21) Appl. No.: 12/524,059

(22) PCT Filed: Jan. 18, 2008

(86) PCT No.: PCT/JP2008/000045
§ 371 (c)(1),
(2), (4) Date: Jul. 22, 2009

(87) PCT Pub. No.: WO2008/090733
PCT Pub. Date: Jul. 31, 2008

(65) Prior Publication Data
US 2010/0019275 A1    Jan. 28, 2010

(30) Foreign Application Priority Data
Jan. 22, 2007 (JP) ................... 2007-011935

(51) Int. Cl.
*H01L 31/00* (2006.01)
(52) U.S. Cl. ................. 257/466; 257/E33.076
(58) Field of Classification Search .................. 257/186, 257/184, E31.019, E31.061, E31.064, 431, 257/466, E33.076
See application file for complete search history.

(56) References Cited

U.S. PATENT DOCUMENTS

2004/0251483 A1* 12/2004 Ko et al. .......... 257/292
2008/0191240 A1*  8/2008 Yagyu et al. ....... 257/186

FOREIGN PATENT DOCUMENTS

| JP | 1994314813 A | 11/1994 |
| JP | 2001177143 A |  6/2001 |
| JP | 2001196623 A |  7/2001 |
| JP | 2005539368 A | 12/2005 |
| WO | 2006123410 A | 11/2006 |

OTHER PUBLICATIONS

International Search Report for PCT/JP2008/000045 mailed Apr. 15, 2008.
I. Watanabe et al., "Design and Performance of InAlGaAs/InAlAs Superlattice Avalanche Photodiodes", Journal of Lightwave Technology, vol. 15, No. 6, Jun. 1997, p. 1012-1019.

* cited by examiner

*Primary Examiner* — Thomas L Dickey
*Assistant Examiner* — Nikolay Yushin

(57) ABSTRACT

A semiconductor photo detector is provided that includes a layer structure deposited over a semiconductor substrate, and having a second mesa formed on the semiconductor substrate and a first mesa formed on the second mesa, wherein an outer periphery of the second mesa is located outside of the outer periphery of the first mesa in two-dimensional view, and wherein surfaces of the first mesa and the second mesa are covered by a passivation film.

28 Claims, 3 Drawing Sheets

SEMICONDUCTOR PHOTO DETECTOR

This application is the National Phase of PCT/JP2008/000045, filed Jan. 18, 2008, which is based upon and claims priority to Japanese Patent Application No. 2007-011935, filed on Jan. 22, 2007.

TECHNICAL FIELD

The present invention relates to a semiconductor photo detector.

BACKGROUND ART

In various types of semiconductor photo detectors, p-i-n photodiode (hereinafter referred to as "PIN photodiode") is well known. This device is capable of detecting photon as photoelectric current that is generated by the following processes, in which an electric field is applied over a low concentration layer of a semiconductor (I layer) sandwiched with a p-type layer and an n-type layer to generate photo carrier in the I layer, which travels therethrough to create photoelectric current.

On the other hand, photo detectors exhibiting higher sensitivity are more useful in the field of optical communications and optical measurements. Devices referred to as avalanche photodiodes (hereinafter, abbreviated as "APD"), which utilize avalanche effect generated by applying strong electric field into a semiconductor, are often employed. A multiplier layer having higher internal electric field is included in a layer configuration of an APD, and ionization is caused in such multiplier layer in a manner similar to chain reaction to amplify photocarrier. Since the noise generated during such amplification process is a noise caused by a shot noise as represented by $2qIM^2F$, such amplification may be achieved, so that such noise is comparable with the thermal noise, to provide an enhanced sensibility of the detector.

The materials and the device structures of the APD may be generally classified by substrate materials (silicon (Si), germanium (Ge), gallium arsenide (GaAs), indium phosphide (InP) or structures (planar-structure and mesa-structure). Planar-structure elements formed on indium phosphide (InP) substrates are often employed in recent years for the APD employed in the area of the optical communications. This is because such type of elements is capable of detecting light having a wave length $\lambda=1.55$ μm, which is utilized in the optical fiber communication, such that it is convenient that indium gallium arsenide (InGaAs), which is in lattice match with an InP substrate, would be employed for optical absorption layer. The use of InGaAs allows receiving light having a wave length of up to 1.6 μm at a room temperature. Another reason for the frequent use of the planar structure is that the use of such structure allows achieving enhanced long term-reliability, which is required for the optical communications. It is known that the mesa-structure device provides easier manufacture but generally reduced long term-reliability, as compared with the planar-structure device.

A typical conventional example of a mesa-structure APD element is shown in FIG. 6. Such conventional mesa-structure APD element is configured that an n-type field-relaxing layer 603, a multiplier layer 604, a p-type field-relaxing layer 605, a p-type light absorption layer 606, a p-type buffer layer 608 and a p-type contact layer 609 are sequentially deposited on a semiconductor substrate 601, and the structure is formed by an etching process to provide the whole p-n junction as a mesa, and in addition, a passivation film 612 is formed outside thereof. A p-type electrode 610 and an n-type electrode 611 are respectively formed, and then a polishing process, a process for forming an anti-reflection film (AR coating), and a process for achieving an element isolation are carried out to produce a front surface incident-type or a back surface-incident type diode for a semiconductor photo detection.

Related literatures include the following literatures.

[Non-Patent Document 1]

Watanabe, I., et al., JOURNAL OF LIGHT WAVE TECHNOLOGY, vol. 15, No. 6, June 1997, p. 1012, entitled "Design and Performance of InAlGaAs/InAlAs Superlattice Avalanche Photodiodes", and

[Patent Document 1]

Japanese Patent Unexamined Publication No. 2005-539368.

DISCLOSURE OF THE INVENTION

The planar structure is mainly employed for the conventional APD for the optical communication. This is because electronic parts for the optical communication applications require higher reliability. However, the manufacture of the planar structure requires a precise control of the internal two-dimensional electric field by suitably processing the surface thereof, and thus the comprehension of the design and the manufacture conditions and/or the acquiring of the manufacture tolerance and the like are difficult. Therefore, various limitation factors may be caused in various aspects such as development cycles, determination of the specifications, production yields and the like. On the other hand, the mesa-structure elements have simpler structure, and thus the comprehension of the design and the manufacture conditions is easier, as compared with the case of the planar-structure elements. Therefore, if the reliability of the mesa-structure element is able to be improved, reduced development cycle for the APD or the rapid change of the design and the specification can be achieved, achieving reduced costs.

According to one exemplary aspect of the present invention, there is provided a semiconductor photo detector having a layer structure comprising: a layer of a first-type conductivity; an undoped layer; a light absorption layer of a second-type conductivity; a selective etching layer of the second-type conductivity; a buffer layer of the second-type conductivity; a contact layer of the second-type conductivity; and an electrode in the side of the second-type conductivity, which are sequentially deposited over a semiconductor substrate, and having a second mesa formed on the semiconductor substrate and a first mesa formed on the second mesa, wherein the first mesa includes the buffer layer of the second-type conductivity, the contact layer of the second-type conductivity, and the electrode in the side of the second-type conductivity, wherein the second mesa includes the layer of the first-type conductivity, the undoped layer, the light absorption layer of the second-type conductivity, and the selective etching layer of the second-type conductivity, wherein an outer periphery of the second mesa is located outside of the outer periphery of the first mesa in two-dimensional view, and wherein at least a side surface of the second mesa is covered by a passivation film.

The semiconductor photo detector of the present invention may also be an APD.

The semiconductor photo detector of the present invention may also be a PIN photodiode.

According to the present invention, deterioration in portions covered with the passivating film is reduced in the semiconductor photo detector having a mesa structure, thereby providing an improved long term reliability.

EXEMPLARY EMBODIMENT

Figure 1:
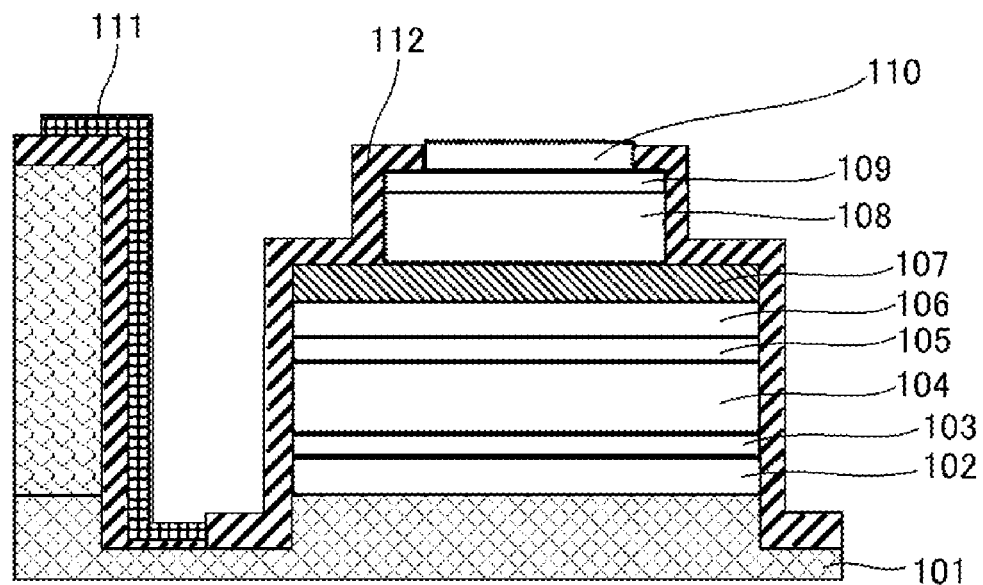
FIG. 1 is a diagram, useful in describing a configuration of first exemplary embodiment according to the present invention.

Exemplary implementations according to the present invention will be described in detail as follows in reference to the annexed figures. In all figures, an identical numeral is assigned to an element commonly appeared in the figures, and the detailed description thereof will not be repeated.

First Exemplary Embodiment

A configuration of a device according to first exemplary embodiment of the present invention will be described in reference to FIG. 1.

A semiconductor photo detector of first exemplary embodiment has a layer-structure, including a selective etching layer 102 of a first-type conductivity, a field-relaxing layer 103 of the first-type conductivity, a multiplier layer 104 (undoped layer), a field-relaxing layer 105 of a second-type conductivity, a light absorption layer 106 of the second-type conductivity, a selective etching layer 107 of the second-type conductivity, a buffer layer 108 of the second-type conductivity, a contact layer 109 of the second-type conductivity, an electrode 110 in the side of the second-type conductivity, which are sequentially deposited on a semiconductor substrate 101.

A second mesa is formed on the semiconductor substrate 101, and a first mesa is formed on the second mesa. The first mesa includes the buffer layer 108 of the second-type conductivity, the contact layer 109 of the second-type conductivity, and the electrode 110 in the side of the second-type conductivity. The second mesa includes the selective etching layer 102 of the first-type conductivity, the field-relaxing layer 103 of the first-type conductivity, the multiplier layer 104, the field-relaxing layer 105 of the second-type conductivity, the light absorption layer 106 of the second-type conductivity, and the selective etching layer 107 of the second-type conductivity. The outer periphery of the second mesa is located outside of the outer periphery of the first mesa in two-dimensional view, and the side surfaces of the first mesa and the second mesa are covered with a passivation film 112.

The semiconductor photo detector of first exemplary embodiment is manufactured as described below. First of all, the selective etching layer 102 of the first-type conductivity, the field-relaxing layer 103 of the first-type conductivity, the multiplier layer 104, the field-relaxing layer 105 of the second-type conductivity, the light absorption layer 106 of the second-type conductivity, the selective etching layer 107 of the second-type conductivity, the buffer layer 108 of the second-type conductivity, the contact layer 109 of the second-type conductivity, and the second-type conductivity electrode 110 are sequentially deposited on the semiconductor substrate 101 in this order from the semiconductor substrate 101 to form an epitaxial crystal. For example, the semiconductor substrate 101 may be an InP substrate.

Subsequently, a first mesa-etching process is conducted to partially remove the buffer layer 108 of the second-type conductivity and the contact layer 109 of the second-type conductivity above the selective etching layer 107 of the second-type conductivity through a selective etching to form a circular first mesa (buffer layer 108 of the second-type conductivity, contact layer 109 of the second-type conductivity, electrode in the side of the second-type conductivity 110).

In such case, the selective etching layer 107 of the second-type conductivity may be formed of InP or $In_xGa_{(1-x)}As_yP_{(1-y)}$. The first mesa in such configuration may be configured to include no phosphorus. More specifically, the buffer layer 108 of the second-type conductivity and the contact layer 109 of the second-type conductivity may be formed of, for example, an As-containing material such as InAlAs, InGaAs, InAlGaAs and the like. In addition, the selective etching layer 107 of the second-type conductivity may be formed of a P-related material or a material contains P such as InP, InGaAsP and the like. The use of these materials allows ensuring larger selectivity for a wet etching process. In such case, acetic acid, phosphoric acid, hydrogen peroxide or the like may be employed as a wet etchant solution to carry out the first mesa etching process.

The selective etching layer 107 of the second-type conductivity may alternatively be InAlAs or $In_xAl_yGa_{(1-x)}As$. The first mesa in such configuration may be formed of InP or $In_xGa_{(1-x)}As_yP_{(1-y)}$. More specifically, the buffer layer 108 of the second-type conductivity and the contact layer 109 of the second-type conductivity may be formed of, for example, a P-containing material such as InP, InGaAsP and the like. Alternatively, the selective etching layer 107 of the second-type conductivity may be InAlAs-related material or InAlGaAs-containing material.

The use of these materials allows ensuring larger selectivity for a wet etching process or a dry etching process. In the case of the wet etching process, hydrochloric acid, phosphoric acid or the like may be employed. In the case of the dry etching process, etchant of $CH_4:H_2:Cl_2$ may be employed. The first mesa etching is carried out in this way to selectively form the first mesa.

In addition to above, the selective etching layer 107 of the second-type conductivity may be formed of $In_xGa_{(1-x)}As_yP_{(1-y)}$, where $y \leq 0.5$. Alternatively, it may be formed of $In_xAl_yGa_{(1-x-y)}As$, where $y \geq 0.25$. This allows effectively preventing an increased generation of dark current in regions right under the circumference (or side wall) of the buffer layer 108 of the second-type conductivity.

After the first mesa etching process, a mask having a mesa diameter that is larger than the dimension of the first mesa is formed, and then a second mesa etching process is carried out to etch the whole epitaxial layer, thereby form the second mesa having a p-n junction.

Hereafter, a selective etching process may be conducted for the selective etching layer 102 of the first-type conductivity to provide a structure having a reduced dimension in the transverse direction (surface direction). In such case, a structure having a reduced dimension in the transverse direction (surface direction) may also be provided for the selective etching layer 107 of the second-type conductivity, depending on the combination of the layers.

Then, a passivating film 112 is formed over the entire mesa, and then an aperture of the passivating film 112 is formed on the top of the first mesa to form the electrode 110 in the side of the second-type conductivity. Further, the electrode 111 of the first-type conductivity is formed separately around the mesa or the like. Then, a polishing process, a process for forming an anti-reflection film (AR coat) and a process for forming an element isolation are carried out to produce the semiconductor photo detector of first exemplary embodiment.

In order to obtain the effect of an improved reliability in the semiconductor photo detector of first exemplary embodiment, the electric field in the second mesa is required to be designed so as to be higher in the bottom part of the first mesa and lower in the peripheral part of the second mesa. Thus, the structure and the impurity concentration of the semiconductor photo detector of first exemplary embodiment may be designed as follows.

Assume that the diameter of the first mesa is represented by $d_1$ (μm) and the diameter of the second mesa is represented by $d_2$ (μm), the relation of the diameters may be designed to be:

$$0 < d_2 - d_1 < d_1 \times 5$$

where $10 \leq d_1 \leq 100$.

The protruding length $(d_2-d_1)/2$ of the second mesa from the first mesa may be designed to be thicker than the thickness of a depleted layer (total thickness of the multiplication layer 104, the electric field relaxation layer 105 of the second-type conductivity, the light absorption layer 106 of the second-type conductivity and the selective etching layer 107 of the second-type conductivity). This allows providing an enhanced effect of the electric field modulation. The thickness of the general depleted layer of the semiconductor photo detector is about 1.0 to 2.0 μm. Thus, the enhanced effect of the electric field modulation can be achieved by satisfying the dimensional relation of $(d_2-d_1)/2 \geq 2.0$ μm.

The field-relaxing level $\Delta E_{2b}$ of the buffer layer 108 of the second-type conductivity is provided to be a value, which achieves reducing by at least equal to or more than 90% of the multiplication electric field. Since the field-relaxing level $\Delta E_{2b}$ is determined by a product of the thickness $d_{2b}$ of the buffer layer 108 of the second-type conductivity and the impurity concentration $N_{2b}$ thereof, a combination of, for example, $d_{2b}=0.1$ μm and $N_{2b}=1\times10^{18}$ cm$^{-3}$ provides sufficient field-relaxing level.

The impurity concentration $N_{1se}$ of the selective etching layer 102 of the first-type conductivity may be suitably provided so as to sufficiently reduce the resistance. For example, the impurity concentration $N_{1se}$ of the selective etching layer 102 of the first-type conductivity may be $N_{1se} > 2\times10^{17}$ cm$^{-3}$.

The impurity concentration $N_{2b}$ of the buffer layer 108 of the second-type conductivity may be suitably adjusted to provide sufficiently reduced resistance through which electric current flows. For example, the impurity concentration $N_{2b}$ of the buffer layer 108 of the second-type conductivity may be set to be equal to or higher than $2\times10^{17}$ cm$^{-3}$.

The position of the terminal end of the depleted layer in the side of the second-type conductivity may be disposed in vicinity of the interface (± about 0.1 μm) between the selective etching layer 107 of the second-type conductivity and the buffer layer 108 of the second-type conductivity or in the inside of the buffer layer 108 of the second-type conductivity.

More specifically, the light absorption layer 106 of the second-type conductivity and the selective etching layer 107 of the second-type conductivity may be designed to satisfy the relation of $\Delta E_{ab} + \Delta E_{2se} \leq 100$ kV/cm, assuming that the field-relaxing level of the light absorption layer 106 of the second-type conductivity is represented by $\Delta E_{ab}$, and the field-relaxing level of the selective etching layer 107 of the second-type conductivity is represented by $\Delta E_{2se}$.

The field-relaxing level is presented by $\Delta E = N \times d \times e_0/(\epsilon_0 \times \epsilon_r)$, where the impurity concentration is N, the layer thickness is d, the elementary electric charge is $e_0$, the dielectric constant of vacuum is $\epsilon_0$, and the specific dielectric constant is $\epsilon_r$. Assuming that the thickness of the light absorption layer 106 of the second-type conductivity is represented by $d_{ab}$, the impurity concentration is represented by $N_{ab}$, the thickness of the selective etching layer 107 of the second-type conductivity is represented by $d_{2se}$, and the impurity concentration is represented by $N_{2se}$, the combinations for satisfying the above-described conditions are derived by the above-described formula as:

In case of $d_{ab}$=0.5 μm and $N_{ab}$=1.0×10$^{16}$ cm$^{-3}$, $N_{2se} \leq 2\times10^{16}$ cm$^{-3}$ for $d_{2se}$=0.1 μm, and $N_{2se} \leq 1\times10^{16}$ cm$^{-3}$ for $d_{2se}$=0.2 μm; (1)

In case of $d_{ab}$=1.0 μm and $N_{ab}$=5.0×10$^{15}$ cm$^{-3}$, $N_{2se} \leq 2\times10^{16}$ cm$^{-3}$ for $d_{2se}$=0.1 μm, and $N_{2se} \leq 1\times10^{16}$ cm$^{-3}$ for $d_{2se}$=0.2 μm; (2)

and

In case of $d_{ab}$=1.5 μm and $N_{ab}$=4×10$^{15}$ cm$^{-3}$, $N_{2se} \leq 1.2\times10^{16}$ cm$^{-3}$ for $d_{2se}$=0.1 μm, and $N_{2se} \leq 0.6\times10^{16}$ cm$^{-3}$ for $d_{2se}$=0.2 μm. (3)

In the condition that the field-relaxing level $\Delta E_{2se}$ of selective etching layer 107 of the second-type conductivity is constant, the dimensional relation may satisfy 0.02 μm $\leq d_{2se}$ for reducing the operation voltage, where the thickness of the selective etching layer 107 of the second-type conductivity is represented by $d_{2se}$. On the other hand, the dimensional relation may satisfy $d_{2se} \leq 0.2$ μm for maintaining the function of the selective etching. Therefore, the dimensional relation may satisfy 0.02 μm $\leq d_{2se} \leq 0.2$ μm to reduce the operating voltage while maintaining the function of the selective etching, thereby obtaining the effect of the electric field modulation.

The advantageous effects of first exemplary embodiment will be described in detail below.

As shown in FIG. 1, according to the invention of the present exemplary embodiment, light may be entered through the first mesa including the electrode 110 in the side of the second-type conductivity, the contact layer 109 of the second-type conductivity and the buffer layer 108 of the second-type conductivity in the semiconductor photo detector of the mesa structure, and the light may be received by the light absorption layer 106 of the second-type conductivity contained in the second mesa located outside of the circumference of the first mesa in two-dimensional view. Alternatively, light may be entered through the substrate 101 and received by the light absorption layer 106. In such case, a light reflected by the electrode 110 of the second-type conductivity may also be received with the light absorption layer 106. When an appropriate voltage is applied to the element for the operating voltage, the electric field of the side wall section having the passivating film 112 can be reduced over the light absorption layer 106 of the second-type conductivity and the underlying undoped layer (multiplication layer 104) and the regions of the layers of the first-type conductivity (selective etching layer 102 of the first-type conductivity and field-relaxing layer 103 of the first-type conductivity), and thus the electric field over the side wall of the second mesa and the side wall of the first mesa is relatively reduced, as compared with the section right under the first mesa, causing a difficulty in the flow of electric current. Therefore, electric current flowing through the interface in the passivating film 112 is relatively reduced, and thus a deterioration of the interface in the passivating film 112 is reduced, ensuring the long term reliability of the semiconductor photo detector.

Figure 6:
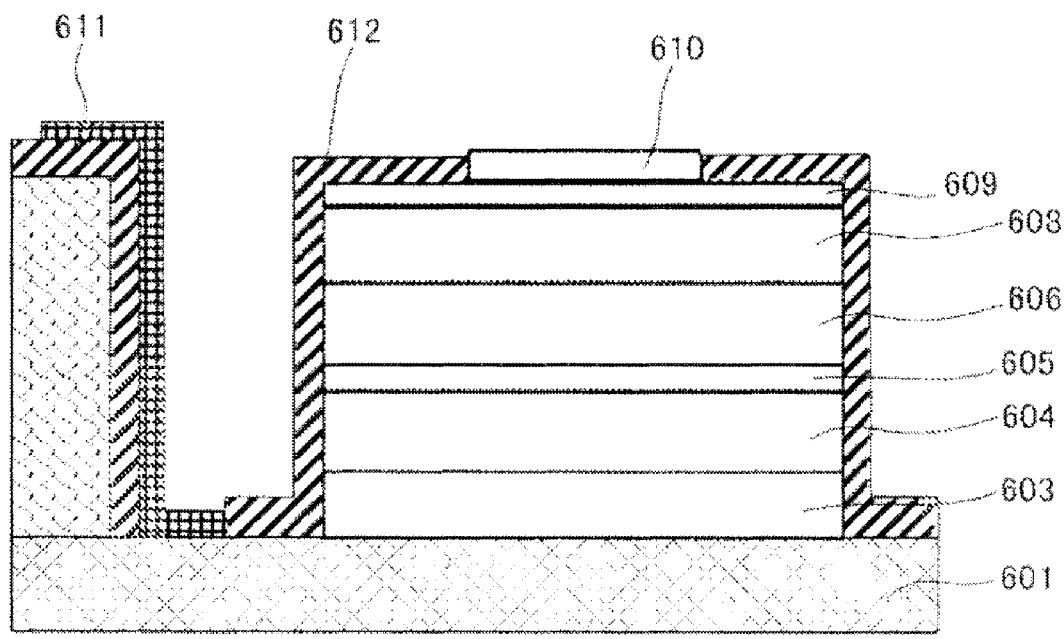
FIG. 6 is a diagram, illustrating a configuration of a conventional mesa-structure avalanche photodiode element.

While the electric field distribution in the depleted layer is a single-dimensional distribution in the conventional mesa-structure semiconductor photo detector illustrated in FIG. 6, an equipotential surface of the depleted layer is modulated in the photosensitive semiconductor element of first exemplary embodiment. More specifically, the electric field right under the outer circumference (or side wall) of the buffer layer of the second-type conductivity is increased over the regions of the light absorption layer of the second-type conductivity and the first field-relaxing layer, and the multiplier layer, as compared with the side wall section having the interface between the semiconductor element and the passivation film. In other words, the electric field is relatively reduced in the sections in the layers of the second-type conductivity outside of the wider second mesa and the narrower first mesa, as compared with the section right under the narrower first mesa, causing a difficulty in the flow of electric current. Therefore, the amperage of an electric current generated in the interface between a semiconductor element and the passivation film during the multiplication operation can be relatively reduced to suitably control the deterioration of the interface.

When a light is not entered, a generation of a dark current is affected by the field strength, and in relation to the flow of a dark current in the condition containing no photocarrier, the electric field is higher in the inside thereof than that of the interface between the semiconductor element and the passivation film. In other words, the electric field in the interface between the semiconductor element and the passivation film is relatively lower in the photo acceptance surface. Therefore, a rate of a generation of dark carrier is increased in the inside of the layer structure to relatively reduce the level of generated dark current, so that an operation with a reduced electric current in the side wall can be achieved without a light incidence, thereby reducing a generation of a dark current in the operation with a higher voltage.

The curvature of the equipotential surface in the profile of internal electric field is the largest in the section right under the outer circumference (or side wall) of the buffer layer of the second-type conductivity, where a local increase of the electric field is generated. Consequently, a use of a material having sufficiently larger band gap (Eg) for the material of the second selective etching layer as compared with the material employed for the light absorption layer of the second-type conductivity, may be effective. For example, when InGaAs is employed for the light absorption layer of the second-type conductivity, $In_xAl_yGa_{(1-x-y)}As$ ($y \geq 0.25$) may be employed for the selective etching layer of the second-type conductivity. In addition, $In_xGa_{(1-x)}As_yP_{(1-y)}$ ($y \leq 0.5$)) may also be employed. This allows effectively preventing an increase in the dark current in the section right under the outer circumference (or side wall) of the buffer layer of the second-type conductivity.

A use of the semiconductor photo detector of first exemplary embodiment allows enhancing the long term reliability of the mesa element structure, and therefore a mesa-structure semiconductor photo detector with higher operating speed, higher sensitivity and higher reliability can be manufactured with a lower cost. This allows presenting optical receivers at lower cost for access network systems with extremely higher speed as compared with the conventional system, such as, for example, a gigabit access-system and the like, thereby achieving popularizations of the optical access network.

Example 1

Figure 2:
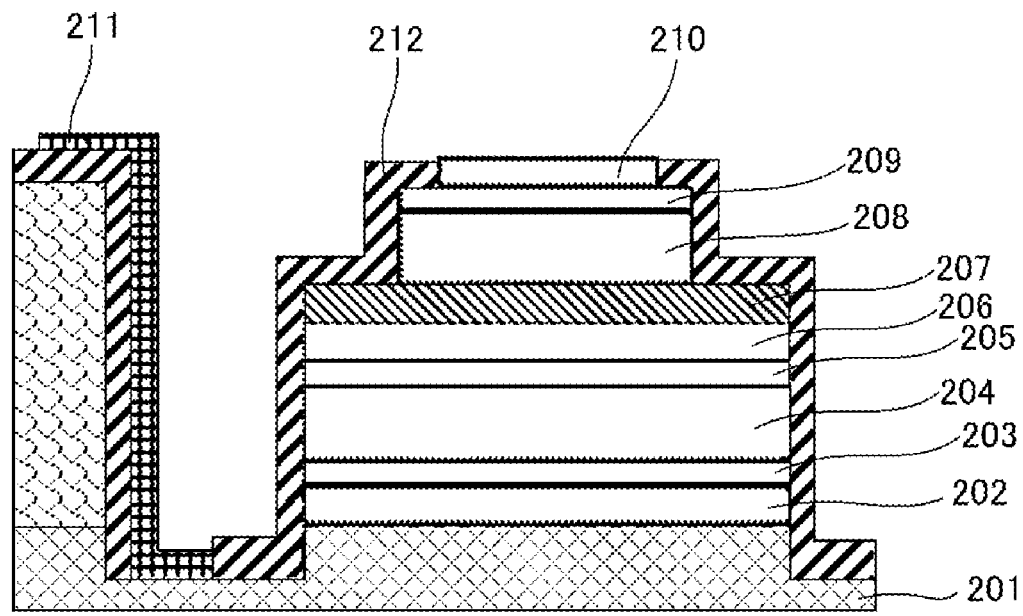
FIG. 2 a diagram, useful in describing a configuration of a semiconductor photo detector of an example 1.

A configuration of a semiconductor photo detector in example 1 is shown in Table 1 and FIG. 2.

TABLE 1

| LAYERS AND NUMERALS | MATERIAL | THICKNESS (μm) | IMPURITY CONCENTRATION ($cm^{-3}$) |
|---|---|---|---|
| SEMICONDUCTOR SUBSTRATE 201 | InP | | |
| N-TYPE SELECTIVE ETCHING LAYER 202 | InP | 0.2 | $1 \times 10^{18}$ |
| N-TYPE BUFFER LAYER 203 | InAlAs | 0.1 | $1 \times 10^{18}$ |
| MULTIPLIER LAYER 204 | InAlAs | 0.2 | UNDOPED |
| P-TYPE FIELD-RELAXING LAYER 205 | InAlAs | 0.1 | $5 \times 10^{17}$ |
| P-TYPE LIGHT ABSORPTION LAYER 206 | InGaAs | 1.0 | $5 \times 10^{15}$ |
| P-TYPE SELECTIVE ETCHING LAYER 207 | InP | 0.2 | $1 \times 10^{16}$ |
| P-TYPE BUFFER LAYER 208 | InAlAs | 0.6 | $1 \times 10^{18}$ |
| P-TYPE CONTACT LAYER 209 | InGaAs | 0.2 | $5 \times 10^{18}$ |

The semiconductor photo detector of example 1 is manufactured as follows. An n-type selective etching layer 202, an n-type buffer layer 203, a multiplier layer 204, a p-type field-relaxing layer 205, a p-type light absorption layer 206, a p-type selective etching layer 207, a p-type buffer layer 208, a p-type contact layer 209 and a p-type electrode 210 are sequentially deposited on the semiconductor substrate 201 in this order from the semiconductor substrate 201 to form an epitaxial crystal.

First of all, a first mesa-etching process is conducted to partially remove the p-type buffer layer 208 and the p-type contact layer 209 above the p-type selective etching layer 207 through a selective etching to form a circular first mesa. In such case, several circular first mesas having a diameter $d_1$ of: $d_1 = 10, 20, 30, 50$ and $100$ μm, respectively; are manufactured.

Then, a second mesa etching process is conducted through a mask that is concentric with the first mesa to form a second mesa including a p-n junction. In such case, several circular second mesas having a diameter $d_2$ of: $d_2 = d_1 + 2, 5, 10, 20$ μm, respectively; are manufactured. The height of the mesa may be designed to be larger than the thickness of the epitaxial layer.

A vertical difference between the deepest position of the etched depth and the top of the mesa may be assumed to be about 3 to 5 μm, and in the case of the present example, not smaller than 2.6 μm.

A passivation film 212 is formed over the entire mesa. Apertures for electrodes are formed in the passivation film 212, and then the p-type electrode 210 is formed in the upper section of the mesa, and the n-type electrode 211 is formed to be in contact with an n-type semiconductor layer (or n-substrate) in the outer circumference of the mesa and associated interconnects are formed to the top of the mesa for the future installation.

The semiconductor element formed in this way is configured that the electric field right under the outer circumference of the selective etching layer is increased over the regions of the p-type light absorption layer 206 and the p-type field-relaxing layer 205, and the multiplier layer 204, as compared with the side wall section having the interface between the semiconductor element and the passivation film. Such effect is larger for the element having larger $d_2$. This allows relatively reducing amperage of an electric current generated in the interface between the semiconductor element and the passivation film to obtain an advantageous effect of an improved reliability.

A dark current generated in the inside of the layer structure is increased in relation to the flow of a dark current in the condition containing no photocarrier, as compared with a dark career caused in the interface between the semiconductor element and the passivation film, and an operation with relatively smaller side wall current can be achieved in a condition without a light incidence. On the other hand, since amperage of a dark current depends on $d_1$ and $d_2$, larger $d_1$, or in the cases of the same $d_1$, larger $d_2$, likely provides larger dark current, which provides a tendency of decreased sensibility in these elements. Therefore, $d_1$ and $d_2$ may be suitably determined according to the purposes (applications) of the elements.

Second Exemplary Embodiment

Configurations of second exemplary embodiment according to the present invention will be described in reference to FIG. 3. The semiconductor photo detector of second exemplary embodiment has a layer-structure, including a selective etching layer 302 of the first-type conductivity, a buffer layer 303 of the first-type conductivity, a multiplier layer 304 (undoped layer), a field-relaxing layer 305 of the second-type conductivity, a light absorption layer 306 of the second-type conductivity, a selective etching layer 307 of the second-type conductivity, a buffer layer 308 of the second-type conductivity, a contact layer 309 of the second-type conductivity, an electrode in the side of the second-type conductivity 310, which are sequentially deposited on a semiconductor substrate 301.

A second mesa is formed on the semiconductor substrate 301, and a first mesa is formed on the second mesa. The first mesa includes the buffer layer 308 of the second-type conductivity, the contact layer 309 of the second-type conductivity, and the electrode 310 in the side of the second-type conductivity. The second mesa includes the selective etching layer 302 of the first-type conductivity, the buffer layer 303 of the first-type conductivity, the multiplier layer 304 (undoped layer), the field-relaxing layer 305 of the second-type conductivity, the light absorption layer 306 of the second-type conductivity, and the selective etching layer 307 of the second-type conductivity.

The outer periphery of the second mesa is located outside of the outer periphery of the first mesa in two-dimensional view, and the side surfaces of the first mesa and the second mesa are covered with a passivation film.

The semiconductor photo detector of second exemplary embodiment is manufactured as described below. First of all, the selective etching layer 302 of the first-type conductivity, the first buffer layer 303, the multiplier layer 304, the field-relaxing layer 305 of the second-type conductivity, the light absorption layer 306 of the second-type conductivity, the selective etching layer 307 of the second-type conductivity, the buffer layer 308 of the second-type conductivity, and the contact layer 309 of the second-type conductivity are sequentially deposited on the semiconductor substrate 301 in this order from the semiconductor substrate 301 to form an epitaxial crystal. For example, the semiconductor substrate 301 may be an InP substrate.

Subsequently, a first mesa-etching process is conducted to partially remove the buffer layer 308 of the second-type conductivity and the contact layer 309 of the second-type conductivity above the selective etching layer 307 of the second-type conductivity through a selective etching to form a circular first mesa (buffer layer 308 of the second-type conductivity, contact layer 309 of the second-type conductivity, electrode in the side of the second-type conductivity 310).

Here, the multiplier layer 304, the field-relaxing layer 305 of the second-type conductivity and the light absorption layer 306 of the second-type conductivity may be formed of an As-containing material (for example, InAlAs, InGaAs, InAlGaAs or the like).

In such case, the selective etching layer 307 of the second-type conductivity may be formed of either InP or $In_xGa_{(1-x)}As_yP_{(1-y)}$. More specifically, a P-related material or a P-containing material (for example, InP, InGaAsP) may be employed for the selective etching layer 307 of the second-type conductivity. While the use of these materials allows ensuring larger selectivity for a wet etching process, the selectivity is not necessarily larger in such case.

In such process, acetic acid, phosphoric acid, hydrogen peroxide or the like may be employed as a wet etchant solution to carry out the first mesa etching process.

Then, a mask having a mesa diameter that is larger than the dimension of the first mesa is formed, and then a second mesa etching process is carried out to etching the whole epitaxial layer, thereby forming the second mesa having a p-n junction (the selective etching layer 302 of the first-type conductivity, the buffer layer 303 of the first-type conductivity, the multiplier layer 304, the field-relaxing layer 305 of the second-type conductivity, and the selective etching layer 307 of the second-type conductivity). In such case, the thickness of the mask formed on the surface of the first mesa may be not smaller than 0.5 µm. The upper limit of the thickness of the mask is not particularly determined, and may preferably be not larger than 1.0 µm.

After second mesa etching process, a selective etching process may be conducted for the selective etching layer 302 of the first-type conductivity to provide a structure having a reduced dimension in the transverse direction (surface direction). In such case, a structure having a reduced dimension in the transverse direction (surface direction) may also be provided for the etching layer 307 of the second-type conductivity, depending on the combination of the layers.

Subsequently, after the second mesa etching process, a hydrogen treatment is carried out from the side of the front surface to form a hydrogen passivation 313. The hydrogen treatment may be conducted via a hydrogen annealing process, or a plasma irradiation with a source material containing hydrogen. Alternatively, such hydrogen treatment operation may be omitted if a passivation film 312 that provides a hydrogen passivation is formed. In the hydrogen treatment, a hydrogenation of the first mesa can be avoided if a thick mask is formed on the first mesa. This allows providing the similar advantageous effects, even if a hydrogen treatment is carried out between the first mesa etching process and second mesa etching process.

When an effect of hydrogen passivation is exhibited in the upper surface of the first mesa during the formation of the hydrogen passivation 313 by the hydrogen treatment and during the formation of the passivation film 312 for providing the hydrogen passivation, the contact resistance with the electrode 310 in the side of the second-type conductivity or the resistance of the contact layer 309 of the second-type conductivity may be possibly increased. Consequently, in case of the formation of the hydrogen passivation 313 by the hydrogen treatment, or before the process for forming the passivation film 312 for providing a hydrogen passivation, a passivation film 314 that provides no hydrogen passivation effect is formed in the upper section of the first mesa. This allows minimizing the passivation effect for the second-type conductivity, avoiding unwanted increased in the resistances of the electrode 310 in the side of the second-type conductivity and the contact layer 309 of the second-type conductivity.

Alternatively, another technique may involves forming the selective etching layer 307 of the second-type conductivity with $In_xAl_yGa_{(1-x-y)}As$ where $y≧0.25$. As described above, a layer containing aluminum (Al) at a larger concentration may be employed as the selective etching layer 307 of the second-type conductivity to allow using a mask exhibiting no hydrogen passivation effect in the first mesa etching process. In such configuration, a layer containing Al at smaller content (<25%) or containing no Al may be employed for the buffer layer 308 of the second-type conductivity and the contact layer 309 of the second-type conductivity. Then, a dry etching process with a recipe containing hydrogen gas (for example, $CH_4:H_2:Cl_2$ etchant gas) is conducted to proceed the etching process to reach the selective etching layer 307 of the second-type conductivity.

In such process, an increased Al content in the selective etching layer 307 of the second-type conductivity provides an increased selectivity of the etching process. When such process is employed, it is possible to provide a hydrogen passivation over the upper surface of the second mesa created by the etchant gas, depending upon the scheme for the apparatus (reactive ion etching (RIE), induced coupled plasma reactive ion etching (ICP-RIE) or the like), the deposition condition (radio frequency (RF) power, gas recipe, etch rate, etching time) or the substrate temperature (25 degrees C. (room temperature) to 300 degrees C.).

Apertures for the electrodes are formed in the passivation film formed by the above-described variety of processes, and then, the electrode 311 in the side of the first type conductivity is formed in the peripherals of the mesa, and then other process such as a polishing process, a process for forming an anti-reflection film (AR coat) and a process for forming an element isolation to produce the semiconductor photo detector of second exemplary embodiment.

In the semiconductor photo detector of the second exemplary embodiment, in order to obtain the effect of an improved reliability, the electric field in the second mesa may be designed so as to be higher in the bottom part of the first mesa and lower in the peripheral part of the first mesa. Consequently, the relation of the structure and the concentration of impurity may be determined as follows.

Assume that the diameter of the first mesa is $d_1$ (μm) and the diameter of the second mesa is $d_2$ (μm), the relation may be $0 < d_2 - d_1 < d_1 \times 5$, when $10 \leq d_1 \leq 100$.

A value of the field-relaxing level $\Delta E_{1b}$ of the buffer layer 303 of the first-type conductivity may be suitably selected so as to provide a relaxation by at least 90% of the multiplied electric field. Since the field-relaxing quantity of $\Delta E_{1b}$ is determined by a product of the thickness $d_{1b}$ of the buffer layer 303 of the first-type conductivity and the concentration of impurity $N_{1b}$, a combination of, for example, $d_{1b}=0.1$ μm and $N_{1b}=1\times10^{-8}$ cm$^{-3}$, may provide sufficient field-relaxing level.

The impurity concentration $N_{1se}$ in the selective etching layer 302 of the first-type conductivity may be suitable selected to provide sufficiently lower resistance. For example, the impurity concentration $N_{1se}$ of the selective etching layer 302 of the first-type conductivity may be $N_{1se} > 2\times10^{17}$ cm$^{-3}$.

In addition, the light absorption layer 306 of the second-type conductivity and the selective etching layer 307 of the second-type conductivity may be suitably configured so as to satisfy the relation of $\Delta E_{ab} + \Delta E_{2se} \leq 100$ kV/cm, where the field-relaxing level of the light absorption layer 306 of the second-type conductivity is represented by $\Delta E_{ab}$ and the field-relaxing level of the selective etching layer 307 of the second-type conductivity is represented by $\Delta E_{2se}$. In order to achieve such relation, a product of the thickness $d_{ab}$ of the light absorption layer 306 of the second-type conductivity and the concentration $N_{ab}$ may be presented as being smaller than a certain value.

The effect of the hydrogen passivation is, depending on the type of the treatment process, exhibited as being exponentially decreased from the surface toward the inside thereof after the hydrogen treatment is conducted, or as having a peak at a certain depth and being exponentially decreased toward the inside from the certain depth. The hydrogen concentration in surface of the second mesa, depending on the type of the treatment process, may be within a range of equal to or higher than $1\times10^{16}$ cm$^{-3}$ and equal to or lower than $5\times10^{18}$ cm$^{-3}$. In addition, the hydrogen concentration in the surface of the light absorption layer 306 of the second-type conductivity may be more preferably within a range of equal to or higher than $1\times10^{16}$ cm$^{-3}$ and equal to or lower than $5\times10^{18}$ cm$^{-3}$. Having such ranges, the hydrogen passivation effect can be preferably obtained. In the doped region of the second-type conductivity that applies the hydrogen passivation, the operation is made so as to decrease the impurity concentration of the second-type conductivity by the hydrogen passivation effect. Assume that the hydrogen passivation has the maximum concentration of $5\times10^{17}$ cm$^{-3}$ in the surface thereof, and a gradient influence for decreasing by one digit at a depth of 1 μm from the surface is provided, the impurity concentration can be increased by such effect. Therefore, it is preferable that the maximum value in the distributed concentration of hydrogen in the second mesa is equal to or higher than $5\times10^{17}$ cm$^{-3}$, and it is more preferable that the maximum value of hydrogen concentration in the light absorption layer 306 of the second-type conductivity is equal to or higher than $5\times10^{17}$ cm$^{-3}$.

The impurity concentration of the light absorption layer 306 of the second-type conductivity may be provided as about $1\times10^{16}$ cm$^{-3}$, and if a hydrogen passivation is presented, $N_{ab}$ may be determined in the side of the surface of the second mesa in the light absorption layer so as to satisfy the following relations.

(1) $N_{ab} \leq 7.0\times10^{17}$ cm$^{-3}$ in the side of the field-relaxing layer 305 of the second-type conductivity, where $d_{ab} \leq 0.5$ μm;

(2) $N_{ab} \leq 6\times10^{16}$ cm$^{-3}$ in the side of the field-relaxing layer 305 of the second-type conductivity, where $0.5$ μm $\leq d_{ab} \leq 1.0$ μm; and (3) $N_{ab} \leq 5.6\times10^{17}$ cm$^{-3}$ in the regions at the depth of equal to or higher than 1.0 μm from the surface, where 1.0 μm $\leq d_{ab} \leq 2.0$ μm.

As described above, in the region at the depth of within 1.0 μm from the surface, it is possible that $N_{ab}$ is increased to a concentration equivalent to the hydrogen passivation level. If a concentration-gradient configuration is added similarly as in the effect of the hydrogen passivation 313 in such case, $N_{ab}$ can be further increased.

Figure 3:
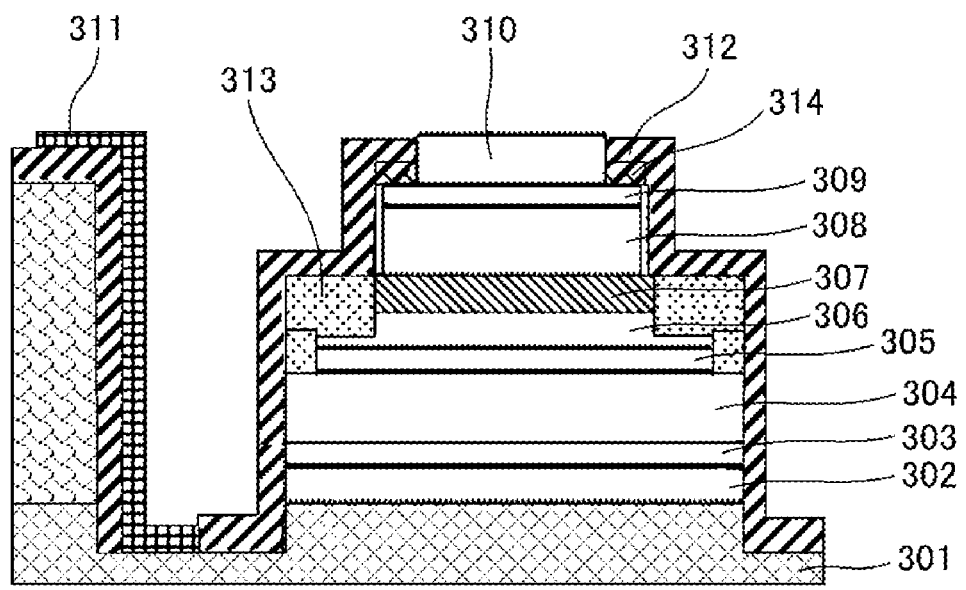
FIG. 3 is a diagram, useful in describing a configuration of second exemplary embodiment according to the present invention.

As shown in FIG. 3, in the semiconductor photo detector formed in this way, the electric field right under the outer circumference (or side wall) of the buffer layer 308 of the second-type conductivity is increased over the regions of the light absorption layer 306 of the second-type conductivity and the field-relaxing layer 305 of the second-type conductivity, and the multiplier layer 304, as compared with the side wall section having the interface of the passivation film 312 for providing the semiconductor element/hydrogen passivation. The modulation effect of the electric field distribution may be increased by conducting the hydrogen treatment. Focusing on the bias, this effect can be clearly found in the bias that is higher than that in the condition, in which the depleted layer extends through the light absorption layer 306 of the second-type conductivity (punchthrough). This effect allows relatively reducing an amperage of an electric current generated in the interface of the passivation film 312 for providing the semiconductor/hydrogen passivation, as compared with the electric current right under the first mesa during multiplication operation irrespective of a light entered therein or not entered, to prevent a deterioration of the semiconductor/passivation interface and to obtain an advantageous effect of an improved reliability.

Since the equipotential surface has a curved profile in the internal electric field in the section right under the outer circumference (or side wall) of the buffer layer 308 of the second-type conductivity, a local increase in the electric field is generated. Consequently, in order to prevent an increase in the dark current in this section, a use of a material ($In_xAl_yGa_{(1-x-y)}As$: y<1, $In_xGa_{(1-x)}As_yP_{(1-y)}$: y<1) having sufficiently larger band gap (Eg) for the material of the second selective etching layer 307 as compared with the material (InGaAs) employed for the light absorption layer 306 of the second-type conductivity, may be effective.

Example 2

Figure 4:
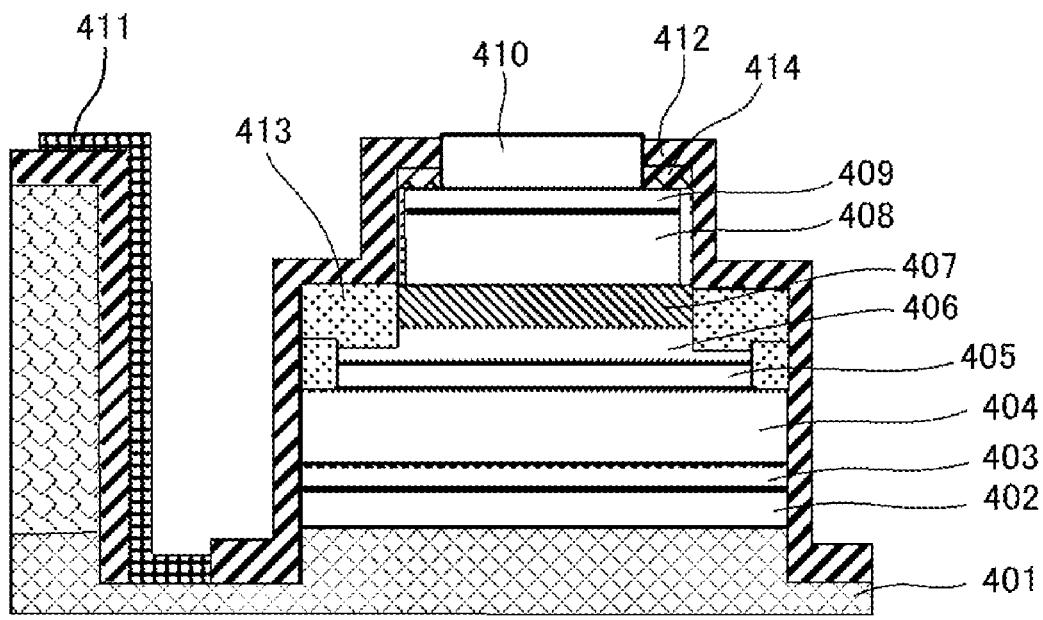
FIG. 4 is a diagram, useful in describing a configuration of a semiconductor photo detector of an example 2.

A configuration of a semiconductor photo detector in example 2 is shown in Table 2 and FIG. 4. A semiconductor photo detector of example 2 is configured that a control of electric field is conducted by utilizing a hydrogen passivation to enhance internal electric field and decrease electric field with the interface of the passivation.

TABLE 2

| LAYERS AND NUMERALS | MATERIAL | THICKNESS (μm) | IMPURITY CONCENTRATION (cm$^{-3}$) |
|---|---|---|---|
| SEMICONDUCTOR SUBSTRATE 401 | InP | | |
| N-TYPE SELECTIVE ETCHING LAYER 402 | InP | 0.2 | $1 \times 10^{18}$ |
| N-TYPE BUFFER LAYER 403 | InAlAs | 0.1 | $1 \times 10^{18}$ |
| MULTIPLIER LAYER 404 | InAlAs | 0.2 | UNDOPED |
| P-TYPE FIELD-RELAXING LAYER 405 | InAlAs | 0.1 | $5 \times 10^{17}$ |
| P-TYPE LIGHT ABSORPTION LAYER 406 | InGaAs | 1.0 | $1 \times 10^{16}$ |
| P-TYPE SELECTIVE ETCHING LAYER 407 | InP | 0.2 | $5 \times 10^{17}$ |
| P-TYPE BUFFER LAYER 408 | InAlAs | 0.6 | $1 \times 10^{18}$ |
| P-TYPE CONTACT LAYER 409 | InGaAs | 0.2 | $5 \times 10^{18}$ |

The semiconductor photo detector of example 2 is manufactured as follows. An n-type selective etching layer 402, an n-type buffer layer 403, a multiplier layer 404, a p-type field-relaxing layer 405, a p-type light absorption layer 406, a p-type selective etching layer 407, a p-type buffer layer 408 and a p-type contact layer 409 are sequentially deposited on a semiconductor substrate 401 in this order from the semiconductor substrate 401 to form an epitaxial crystal.

Subsequently, a first mesa-etching process is conducted to partially remove the p-type buffer layer 408, the p-type contact layer 409 and a p-type electrode 410 above the p-type selective etching layer 407 through a selective etching to form a circular first mesa. Here, several circular first mesas having a diameter $d_1$ of: $d_1$=10, 20, 30, 50 and 100 μm, respectively; are manufactured.

Then, a second mesa etching process is conducted through a mask of a passivating film 414 that is concentric with the first mesa and has a large mesa diameter $d_2$ and provides no hydrogen passivation such as $SiO_2$ and the like to form a second mesa including a p-n junction. The height of the mesa may be designed to be larger than the thickness of the epitaxial layer. In the case of the present example, the height of the mesa may be not smaller than 2.6 μm, and a vertical difference between the deepest position of the etched depth and the top of the mesa may be assumed to be about 3 to 5 μm.

A hydrogen treatment is conducted from the mesa surface to provide the hydrogen passivation 413, and then the passivating film 412 for providing a hydrogen passivation is formed over the entire mesa. Apertures for electrodes are formed in the two passivation films, and then the p-type electrode 410 is formed in the upper section of the mesa, and the n-type electrode 411 is formed to be in contact with an n-type semiconductor layer (or n-substrate) in the outer circumference of the mesa and associated interconnects are formed to the top of the mesa for the future installation.

The semiconductor photo detector formed in this way is configured that the electric field right under the outer circumference of the selective etching layer is increased over the regions of the p-type light absorption layer 406 and the p-type field-relaxing layer 405, and the multiplier layer 404, as compared with the side wall section having the interface between the semiconductor element and the passivation film.

Such effect is larger for the element having larger $d_2$. This allows relatively reducing amperage of an electric current generated in the interface between the semiconductor element and the passivation film during multiplication operation, to obtain an advantageous effect of an improved reliability. A dark current generated in the inside of the layer structure is increased in relation to the flow of a dark current in the condition containing no photocarrier, as compared with a dark career caused in the interface between the semiconductor element and the passivation film, and an operation with relatively smaller side wall current can be achieved in a condition without a light incidence. On the other hand, amperage of a dark current depends on $d_1$ and $d_2$. Larger $d_1$, or in the cases of the same $d_1$, larger $d_2$, likely provides larger dark current, and the maximum multiplication factor is likely decreased.

Thus, $d_1$ and $d_2$ may be suitably determined according to the purposes (applications) of the elements.

Example 3

Figure 5:
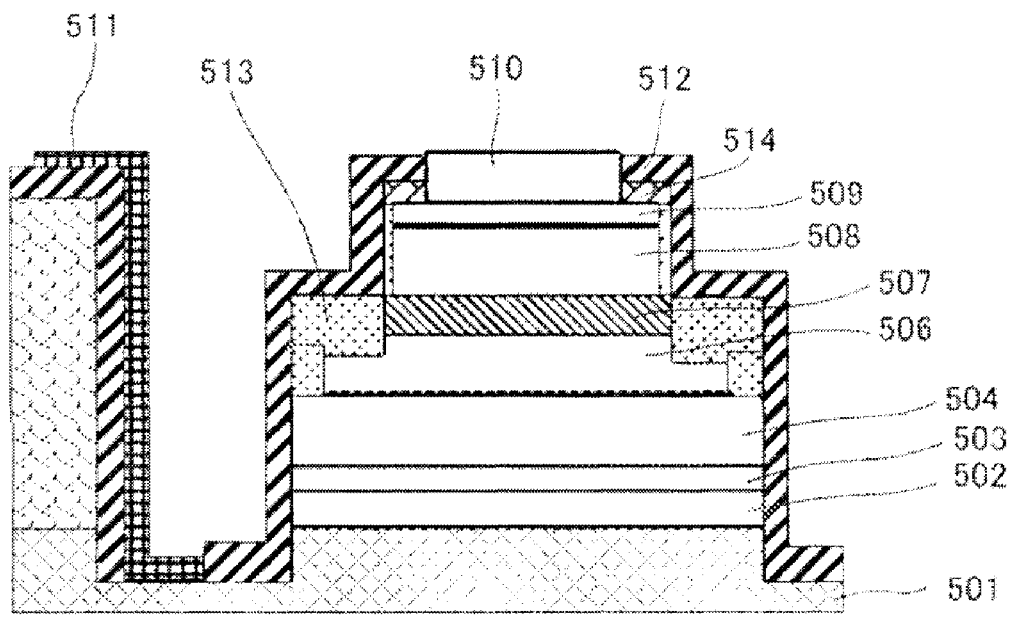
FIG. 5 is a diagram, illustrating a configuration of a semiconductor photo detector of an example 3.

A configuration of a semiconductor photo detector in example 3 is shown in Table 3 and FIG. 5. A semiconductor photo detector of example 3 is configured to have a PIN-PD structure, in which a control of electric field is conducted by utilizing a hydrogen passivation to enhance internal electric field and decrease electric field with the interface of the passivation.

TABLE 3

| LAYERS AND NUMERALS | MATERIAL | THICKNESS (μm) | IMPURITY CONCENTRATION (cm$^{-3}$) |
|---|---|---|---|
| SEMICONDUCTOR SUBSTRATE 501 | InP | | |
| N-TYPE SELECTIVE ETCHING LAYER 502 | InP | 0.2 | $1 \times 10^{18}$ |
| N-TYPE BUFFER LAYER 503 | InAlAs | 0.1 | $1 \times 10^{18}$ |
| N-TYPE ELECTRON | InAlAs | 1.0 | $1 \times 10^{16}$ |

TABLE 3-continued

| LAYERS AND NUMERALS | MATERIAL | THICKNESS (μm) | IMPURITY CONCENTRATION (cm$^{-3}$) |
|---|---|---|---|
| TRANSPORT LAYER 504 | | | |
| P-TYPE LIGHT ABSORPTION LAYER 506 | InGaAs | 1.0 | $1 \times 10^{16}$ |
| P-TYPE SELECTIVE ETCHING LAYER 507 | InP | 0.2 | $5 \times 10^{17}$ |
| P-TYPE BUFFER LAYER 508 | InAlAs | 0.6 | $1 \times 10^{18}$ |
| P-TYPE CONTACT LAYER 509 | InGaAs | 0.2 | $5 \times 10^{18}$ |

The semiconductor photo detector of example 3 is manufactured as follows. An n-type selective etching layer 502, an n-type buffer layer 503, an n-type electron transport layer 504, a p-type light absorption layer 506, a p-type selective etching layer 507, a p-type buffer layer 508 and a p-type contact layer 509 are sequentially deposited on the semiconductor substrate 501 in this order from the semiconductor substrate 501 to form an epitaxial crystal.

Subsequently, a first mesa-etching process is conducted to partially remove the p-type buffer layer 508 and the p-type contact layer 509 above the p-type selective etching layer 507 through a selective etching to form a circular first mesa.

Here, several circular first mesas having a diameter $d_1$ of: $d_1$=10, 20, 30, 50 and 100 μm, respectively; are manufactured.

Then, a second mesa etching process is conducted through a mask of a passivating film 514 that is concentric with the first mesa and has a large mesa diameter $d_2$ ($d_2$=$d_1$+2, 5, 10, 20 μm) and provides no hydrogen passivation such as SiO$_2$ and the like to form a second mesa including a p-n junction. The height of the mesa may be designed to be larger than the thickness of the epitaxial layer. In the case of the present example, the height of the mesa may be not smaller than 2.6 μm, and a vertical difference between the deepest position of the etched depth and the top of the mesa may be assumed to be about 3 to 5 μm.

A hydrogen treatment is conducted from the mesa surface to provide the hydrogen passivation 513, and then the passivating film 512 for providing a hydrogen treatment is formed over the entire mesa. Apertures for electrodes are formed in the two passivation films, and then the p-type electrode 510 is formed in the upper section of the mesa, and the n-type electrode 511 is formed to be in contact with an n-type semiconductor layer (or n-substrate) in the outer circumference of the mesa and associated interconnects are formed to the top of the mesa for the future installation. The semiconductor element formed in this way is configured that the electric field right under the outer circumference of the selective etching layer is increased over the regions of the p-type light absorption layer 506 and the n-type electron transport layer 504, as compared with the side wall section having the interface between the semiconductor element and the passivation film. Such effect is larger for the element having larger $d_2$. This allows relatively reducing amperage of an electric current generated in the interface between the semiconductor element and the passivation film to obtain an advantageous effect of an improved reliability. A dark current generated in the inside of the layer structure is increased in relation to the flow of a dark current in the condition containing no photocarrier, as compared with a dark career caused in the interface between the semiconductor element and the passivation protective film, and an operation with relatively smaller side wall current can be achieved in a condition without a light incidence. On the other hand, amperage of a dark current depends on $d_1$ and $d_2$. Since larger $d_1$, or in the cases of the same $d_1$, larger $d_2$, likely provides larger dark current, the sensibility in these elements are likely decreased. Thus, $d_1$ and $d_2$ are suitably determined according to the purposes (applications) of the semiconductor elements.

While the preferred exemplary embodiments of the present invention have been described above in reference to the annexed figures, it should be understood that the disclosures above are presented for the purpose of illustrating the present invention, and various modifications other than that described above are also available.

For example, while the example illustrates that the hydrogen treatment is conducted from the surface of the mesa after the second mesa is formed to provide the hydrogen passivation, the hydrogen treatment may be alternatively carried out before the second mesa is formed. Even if the hydrogen treatment is conducted before forming the second mesa, the obtained structure is almost the same as the structure that the present invention is intended to include, and the advantageous effects may be similarly obtained.

The semiconductor photo detector of the present exemplary embodiment may alternatively be an APD. Conventional APDs cannot provide an easier manufacturing while ensuring better long term reliability. On the contrary, according to the present invention, an APD for ensuring the long term reliability, providing the rapid change of the design and the specification and achieving reduced cost can be presented.

The semiconductor photo detector of the present invention may alternatively be a PIN photodiode. Conventional PIN photodiodes cannot provide an easier manufacturing while ensuring better long term reliability. On the contrary, according to the present invention, a PIN photodiode for ensuring the long term reliability, providing the rapid change of the design and the specification and achieving reduced cost can be presented.

The following configurations may be adopted for the present invention.

(1) A semiconductor photo detector of a mesa-structure semiconductor photo detector, having a structure having a layer of a first-type conductivity, an undoped layer, a light absorption layer of a second-type conductivity, a selective etching layer of the second-type conductivity, and a buffer layer of the second-type conductivity, which are deposited on a semiconductor substrate in this order, a whole PN junction being formed to be a mesa-shape, wherein semiconductor photo detector includes two mesas of different sizes, which includes a first mesa in the buffer layer of the second-type conductivity and sections above thereof, and a second mesa larger than the first mesa in the selective etching layer and sections under thereof.

(2) The semiconductor photo detector as set forth in the above (1), which is formed on an InP substrate.

(3) The semiconductor photo detector as set forth in the above (2), which is an APD.

(4) The semiconductor photo detector as set forth in the above (2), in which a concentration in the buffer layer of the second-type conductivity is equal to or higher than $2 \times 10^{17}$ cm$^{-3}$.

(5) The semiconductor photo detector as set forth in the above (1), in which a thickness $d_{2se}$ of the selective etching layer of the second-type conductivity is presented as: $0.02$ μm$\leq d_{2se}$.

(6) The semiconductor photo detector as set forth in the above (1), in which a thickness $d_{2se}$ of the selective etching layer of the second-type conductivity is presented as: $d_{2se} \leq 0.2$ μm.

(7) The semiconductor photo detector as set forth in the above (1), in which a thickness $d_{2se}$ of the selective etching layer of the second-type conductivity is presented as: $0.02\ \mu m \leq d_{2se} \leq 0.2\ \mu m$.

(8) The semiconductor photo detector as set forth in the above (1), in which the selective etching layer of the second-type conductivity is formed of InP or $In_xGa_{(1-x)}As_yP_{(1-y)}$.

(9) The semiconductor photo detector as set forth in the above (8), in which the band gap of the selective etching layer of the second-type conductivity is sufficiently larger, as compared with InGaAs ($In_xGa_{(1-x)}As_yP_{(1-y)}$, y<0.5).

(10) The semiconductor photo detector as set forth in the above (8), in which sections above the buffer layer of the second-type conductivity contain no phosphorus (P).

(11) The semiconductor photo detector as set forth in the above (1), in which the selective etching layer of the second-type conductivity is formed of InAlAs or $In_xGa_{(1-x)}As_yP_{(1-y)}$.

(12) The semiconductor photo detector as set forth in the above (10), in which the band gap of the selective etching layer of the second-type conductivity is sufficiently larger, as compared with InGaAs ($In_xGa_{(1-x)}As_yP_{(1-y)}$, y<0.5) or ($In_xAl_yGa_{(1-x-y)}As$, y>0.25).

(13) The semiconductor photo detector as set forth in the above (10), in which sections above the buffer layer of the second-type conductivity is formed of InP or $In_xGa_{(1-x)}As_yP_{(1-y)}$.

(14) The semiconductor photo detector as set forth in the above (1), in which a total of a field-relaxing level $\Delta E_{ab}$ of the light absorption layer and a field-relaxing level $\Delta E_{2se}$ of the second selective etching layer is selected to be equal to or lower than 100 kV/cm.

(15) The semiconductor photo detector as set forth in the above (1), in which a total of a field-relaxing level $\Delta E_{ab}$ of the light absorption layer and a field-relaxing level $\Delta E_{2se}$ of the second selective etching layer is selected to be equal to or lower than 100 kV/cm, and a relation of $N_{2se} \leq 2\times 10^{16}\ cm^{-3}$ is satisfied for $d_{2se}=0.1\ \mu m$, where a thickness $d_{ab}$ of the light absorption layer thickness is: $d_{ab}=0.5\ \mu m$, and a concentration $N_{2ab}$ is: $N_{2ab}=1.0\times 10^{16}\ cm^{-3}$.

(16) The semiconductor photo detector as set forth in the above (1), in which a total of a field-relaxing level $\Delta E_{ab}$ of the light absorption layer and a field-relaxing level $\Delta E_{2se}$ of the second selective etching layer is selected to be equal to or lower than 100 kV/cm, and a relation of $N_{2se} \leq 2\times 10^{16}\ cm^{-3}$ is satisfied for $d_{2se}=0.1\ \mu m$, where $d_{ab}=1.0\ \mu m$, and a concentration $N_{2ab}$ is: $N_{2ab}=5.0\times 10^{15}\ cm^{-3}$.

(17) The semiconductor photo detector as set forth in the above (1), in which a total of a field-relaxing level $\Delta E_{ab}$ of the light absorption layer and a field-relaxing level $\Delta E_{2se}$ of the second selective etching layer is selected to be equal to or lower than 100 kV/cm, and a relation of $N_{2se} \leq 1.2\times 10^{16}\ cm^{-3}$ is satisfied for $d_{2se}=0.1\ \mu m$, where $d_{ab}=1.5\ \mu m$, and a concentration $N_{2ab}$ is: $N_{2ab}=4\times 10^{15}\ cm^{-3}$.

(18) The semiconductor photo detector as set forth in the above (1), in which sections of the second mesa section disposed outside of the circumference of the first mesa contains hydrogen at a concentration of equal to or higher than at least about $1\times 10^{16}\ cm^{-3}$.

(19) The semiconductor photo detector as set forth in the above (1), in which sections of the second mesa section disposed outside of the circumference of the first mesa contains hydrogen with a concentration distribution having a maximum value of equal to or higher than at least about $5\times 10^{17}\ cm^{-3}$.

(20) The semiconductor photo detector as set forth in the above (1), in which a mask having a thickness of equal to or larger than 0.5 μm is formed on the first mesa in a process of a hydrogen treatment for the second mesa.

What is claimed is:

1. A semiconductor photo detector, having a layer structure comprising: a layer of a first-type conductivity; a light absorption layer of a second-type conductivity; a selective etching layer of the second-type conductivity; a buffer layer of the second-type conductivity; a contact layer of the second-type conductivity; and an electrode in the side of the second-type conductivity, which are sequentially deposited over a semiconductor substrate, and having a second mesa formed on said semiconductor substrate and a first mesa formed on said second mesa, wherein said first mesa includes said buffer layer of the second-type conductivity, said contact layer of the second-type conductivity, and said electrode in the side of the second-type conductivity, wherein said second mesa includes an outer periphery located outside of the outer periphery of said first mesa in two-dimensional view, and a second mesa semiconductor staked structure including said layer of the first-type conductivity, said light absorption layer of the second-type conductivity, said selective etching layer of the second-type conductivity, and a hydrogen passivation region, wherein at least a side surface of said second mesa semiconductor staked structure is covered with a passivation film, and wherein said hydrogen passivation region is formed from a surface of said second mesa semiconductor staked structure toward an inside of said second mesa semiconductor staked structure.

2. The semiconductor photo detector as set forth in claim 1, wherein said passivation film is a passivation film for providing said hydrogen passivation.

3. The semiconductor photo detector as set forth in claim 1, wherein said hydrogen passivation region is formed from a surface of said second mesa semiconductor staked structure in parallel to said substrate which is not covered by said first mesa toward an inside of said second mesa semiconductor staked structure.

4. The semiconductor photo detector as set forth in claim 1, wherein said hydrogen passivation region is formed from a surface of said second mesa semiconductor staked structure toward the region at the depth of about 1.0 μm from a surface of said second mesa semiconductor staked structure.

5. The semiconductor photo detector as set forth in claim 1, wherein a value of a hydrogen concentration in said hydrogen passivation region is concentration-gradient from a surface of said second mesa semiconductor staked structure toward a depth direction.

6. The semiconductor photo detector as set forth in claim 1, wherein a hydrogen concentration in said hydrogen passivation region is equal to or higher than $1\times 10^{16}\ cm^{-3}$ and equal to or lower than $5\times 10^{18}\ cm^{-3}$.

7. The semiconductor photo detector as set forth in claim 1, wherein a maximum value of a hydrogen concentration in said hydrogen passivation region is equal to or higher than $5\times 10^{17}\ cm^{-3}$.

8. The semiconductor photo detector as set forth in claim 1, wherein at least said hydrogen passivation region includes said light absorption layer of the second-type conductivity.

9. The semiconductor photo detector as set forth in claim 1, wherein a hydrogen concentration in said light absorption layer of the second-type conductivity included in said hydrogen passivation region is equal to or higher than $1\times 10^{16}\ cm^{-3}$ and equal to or lower than $5\times 10^{18}\ cm^{-3}$.

10. The semiconductor photo detector as set forth in claim 1, wherein a maximum value of a hydrogen concentration in said light absorption layer of the second-type conductivity included in said hydrogen passivation region is equal to or higher than $5 \times 10^{17}$ cm$^{-3}$.

11. The semiconductor photo detector as set forth in claim 1, wherein said semiconductor substrate is an indium phosphide (InP) substrate.

12. The semiconductor photo detector as set forth in claim 1, wherein said semiconductor photo detector is a PIN photodiode.

13. The semiconductor photo detector as set forth in claim 1, wherein said second mesa semiconductor staked structure includes an undoped layer between said layer of a first-type conductivity and said light absorption layer of the second-type conductivity.

14. The semiconductor photo detector as set forth in claim 13, wherein said semiconductor photo detector is an avalanche photodiode.

15. The semiconductor photo detector as set forth in claim 1, wherein a concentration of impurity in said buffer layer of the second-type conductivity is equal to or higher than $2 \times 10^{17}$ cm$^{-3}$.

16. The semiconductor photo detector as set forth in claim 1, wherein a thickness $d_{2se}$ of said selective etching layer of the second-type conductivity satisfies as:

$$0.02 \text{ μm} \leq d_{2se}.$$

17. The semiconductor photo detector as set forth in claim 1, wherein a thickness $d_{2se}$ of said selective etching layer of the second-type conductivity satisfies as:

$$d_{2se} < 0.2 \text{ μm}.$$

18. The semiconductor photo detector as set forth in claim 1, wherein a thickness $d_{2se}$ of said selective etching layer of the second-type conductivity satisfies as:

$$0.02 \text{ μm} \leq d_{2se} < 0.2 \text{ μm}.$$

19. The semiconductor photo detector as set forth in claim 1 wherein said selective etching layer of the second-type conductivity is formed of InP or $In_xGa_{(1-x)}As_yP_{(1-y)}$.

20. The semiconductor photo detector as set forth in claim 1, wherein said selective etching layer of the second-type conductivity is formed of $In_xGa_{(1-x)}As_yP_{(1-y)}$, where $y \leq 0.5$.

21. The semiconductor photo detector as set forth in claim 1, wherein said selective etching layer of the second-type conductivity is formed of $In_xAl_yGa_{(1-x-y)}As$, where $y \geq 0.25$.

22. A semiconductor photo detector, having a layer structure comprising: a layer of a first-type conductivity; a light absorption layer of a second-type conductivity; a selective etching layer of the second-type conductivity; a buffer layer of the second-type conductivity; a contact layer of the second-type conductivity; and an electrode in the side of the second-type conductivity, which are sequentially deposited over a semiconductor substrate, and having a second mesa formed on said semiconductor substrate and a first mesa formed on said second mesa, wherein said first mesa includes said buffer layer of the second-type conductivity, said contact layer of the second-type conductivity, and said electrode in the side of the second-type conductivity, wherein said second mesa includes an outer periphery located outside of the outer periphery of said first mesa in two-dimensional view, and a second mesa semiconductor staked structure including said layer of the first-type conductivity, said light absorption layer of the second-type conductivity, said selective etching layer of the second-type conductivity, and a hydrogen passivation region, wherein at least a side surface of said second mesa semiconductor staked structure is covered with a passivation film, wherein said selective etching layer of the second-type conductivity is formed of InP or $In_xGa_{(1-x)}As_yP_{(1-y)}$, and said first mesa contains no phosphorus.

23. The semiconductor photo detector as set forth in claim 1, wherein said selective etching layer of the second-type conductivity is formed of InAlAs or $In_xAl_yGa_{(1-x)}As$.

24. The semiconductor photo detector as set forth in claim 23, wherein said first mesa is formed of InP or $In_xGa_{(1-x)}As_yP_{(1-y)}$.

25. A semiconductor photo detector, having a layer structure comprising: a layer of a first-type conductivity; a light absorption layer of a second-type conductivity; a selective etching layer of the second-type conductivity; a buffer layer of the second-type conductivity; a contact layer of the second-type conductivity; and an electrode in the side of the second-type conductivity, which are sequentially deposited over a semiconductor substrate, and having a second mesa formed on said semiconductor substrate and a first mesa formed on said second mesa, wherein said first mesa includes said buffer layer of the second-type conductivity, said contact layer of the second-type conductivity, and said electrode in the side of the second-type conductivity, wherein said second mesa includes an outer periphery located outside of the outer periphery of said first mesa in two-dimensional view, and a second mesa semiconductor staked structure including said layer of the first-type conductivity, said light absorption layer of the second-type conductivity, said selective etching layer of the second-type conductivity, and a hydrogen passivation region, wherein at least a side surface of said second mesa semiconductor staked structure is covered with a passivation film and wherein said light absorption layer and said selective etching layer of the second-type conductivity satisfy the relation of:

$$\Delta E_{ab} + \Delta E_{2se} \leq 100 \text{ kV/cm},$$

where a field-relaxing level of said light absorption layer of the second-type conductivity is defined as $\Delta E_{ab}$, and the field-relaxing level of said selective etching layer of the second-type conductivity is defined as $\Delta E_{2se}$.

26. The semiconductor photo detector as set forth in claim 25, wherein the semiconductor photo detector satisfies the relations of:

$$d_{ab} = 0.5 \text{ μm},$$

$$N_{ab} = 1.0 \times 10^{16} \text{ cm}^{-3},$$

where the thickness of said light absorption layer of the second-type conductivity is defined as $d_{ab}$, and the concentration of impurity in said light absorption layer of the second-type conductivity is defined as $N_{ab}$, and $$d_{2se} = 0.1 \text{ μm},$$

$$N_{2se} \leq 2 \times 10^{16} \text{ cm}^{-3},$$

where the thickness of said selective etching layer of the second-type conductivity is defined as $d_{2se}$, and the concentration of impurity in said selective etching layer of the second-type conductivity is defined as $N_{2se}$.

27. The semiconductor photo detector as set forth in claim 25, wherein $d_{ab}$=1.0 µm, $N_{ab}$=5.0×10$^{15}$ cm$^{-3}$, where the thickness of said light absorption layer of the second-type conductivity is defined as $d_{ab}$, and the concentration of impurity in said light absorption layer of the second-type conductivity is defined as $N_{ab}$, and $d_{2se}$=0.1 µm, $N_{2se}$≦2×10$^{16}$ cm$^{-3}$ where the thickness of said selective etching layer of the second-type conductivity is defined as $d_{2se}$, and the concentration of impurity in said selective etching layer of the second-type conductivity is defined as $N_{2se}$.

28. The semiconductor photo detector as set forth in claim 25, wherein $d_{ab}$=1.5 µm, $N_{ab}$=4×10$^{15}$ cm$^{-3}$, where the thickness of said light absorption layer of the second-type conductivity is defined as $d_{ab}$, and the concentration of impurity in said light absorption layer of the second-type conductivity is defined as $N_{ab}$, and $d_{2se}$=0.1 µm, $N_{2se}$≦1.2×10$^{16}$ cm$^{-3}$ where the thickness of said selective etching layer of the second-type conductivity is defined as $d_{2se}$, and the concentration of impurity in said selective etching layer of the second-type conductivity is defined as $N_{2se}$.

* * * * *